(12) United States Patent
Washio et al.

(10) Patent No.: US 12,306,258 B2
(45) Date of Patent: May 20, 2025

(54) CALCULATION DEVICE

(71) Applicant: Prime Planet Energy & Solutions, Inc., Tokyo (JP)

(72) Inventors: Yuka Washio, Kasai (JP); Jun Kikuchi, Kakogawa (JP)

(73) Assignee: PRIME PLANET ENERGY & SOLUTIONS, INC., Tokyo (JP)

( * ) Notice: Subject to any disclaimer, the term of this patent is extended or adjusted under 35 U.S.C. 154(b) by 145 days.

(21) Appl. No.: 18/183,953

(22) Filed: Mar. 15, 2023

(65) Prior Publication Data

US 2023/0296686 A1     Sep. 21, 2023

(30) Foreign Application Priority Data

Mar. 18, 2022   (JP) ................ 2022-043739

(51) Int. Cl.
*G01R 31/389*    (2019.01)
*G01R 31/3842*   (2019.01)
*H01M 10/48*     (2006.01)

(52) U.S. Cl.
CPC ....... *G01R 31/389* (2019.01); *G01R 31/3842* (2019.01); *H01M 10/48* (2013.01); *H01M 2220/20* (2013.01)

(58) Field of Classification Search
None
See application file for complete search history.

(56) References Cited

U.S. PATENT DOCUMENTS

2008/0169819 A1*  7/2008  Ishii ............... G01R 31/389
                                                    324/430
2023/0366939 A1* 11/2023  Uno ................ H01M 10/425

FOREIGN PATENT DOCUMENTS

| JP | 2011-137681 A | 7/2011 |
| JP | 2016-118123 A | 6/2016 |
| JP | 2021-68611 A  | 4/2021 |
| JP | 2021-118063 A | 8/2021 |
| WO | 2006/022073 A1 | 3/2006 |
| WO | 2019/025574 A1 | 2/2019 |

* cited by examiner

*Primary Examiner* — Jas A Sanghera
(74) *Attorney, Agent, or Firm* — HAUPTMAN HAM, LLP

(57) ABSTRACT

An SBM measures a voltage of a battery, detects a voltage feature quantity, and transmits the voltage feature quantity to a BMU. The BMU measures a current of the battery, detects a current feature quantity, obtains the voltage feature quantity transmitted from the transmission unit, and calculates an impedance of the battery based on the current feature quantity and the voltage feature quantity received within a predetermined period from a time at which the current feature quantity is obtained.

6 Claims, 10 Drawing Sheets

CALCULATION DEVICE

This nonprovisional application is based on Japanese Patent Application No. 2022-043739 filed on Mar. 18, 2022 with the Japan Patent Office, the entire contents of which are hereby incorporated by reference.

BACKGROUND OF THE INVENTION

Field of the Invention

The present disclosure relates to a calculation device.

Description of the Background Art

For example, Japanese Patent Laying-Open No. 2021-68611 discloses a monitoring system for monitoring respective states of a plurality of battery modules. In this monitoring system, a current detection sensor that detects a current value of a battery module and a voltage detection sensor that detects a voltage value of the battery module are provided for each battery module.

SUMMARY OF THE INVENTION

In the above-described monitoring system, each of the number of the provided current detection sensors and the number of the provided voltage detection sensors is the same as the number of the battery modules, thus resulting in increased manufacturing cost, disadvantageously.

The present disclosure has been made to solve the above-described problem and has an object to provide a technology for calculating an impedance of a battery while suppressing manufacturing cost.

A calculation device according to the present disclosure calculates an impedance of a battery. The calculation device includes a first device and a second device. The first device measures a first parameter that is one of a current of the battery and a voltage of the battery, detects a first feature quantity that is a feature quantity of the first parameter, and transmits the first feature quantity to the second device. The second device measures a second parameter that is the other of the current and the voltage, detects a second feature quantity that is a feature quantity of the second parameter, obtains the first feature quantity transmitted from the first device, and calculates the impedance based on the first feature quantity and the second feature quantity, the first feature quantity being received within a predetermined period from a time at which the second feature quantity is obtained.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a diagram for illustrating timings of detection of a current feature quantity and the like.

FIG. 6 is a diagram for illustrating the timings of detection of the current feature quantity and the like.

DESCRIPTION OF THE PREFERRED EMBODIMENTS

Figure 1:
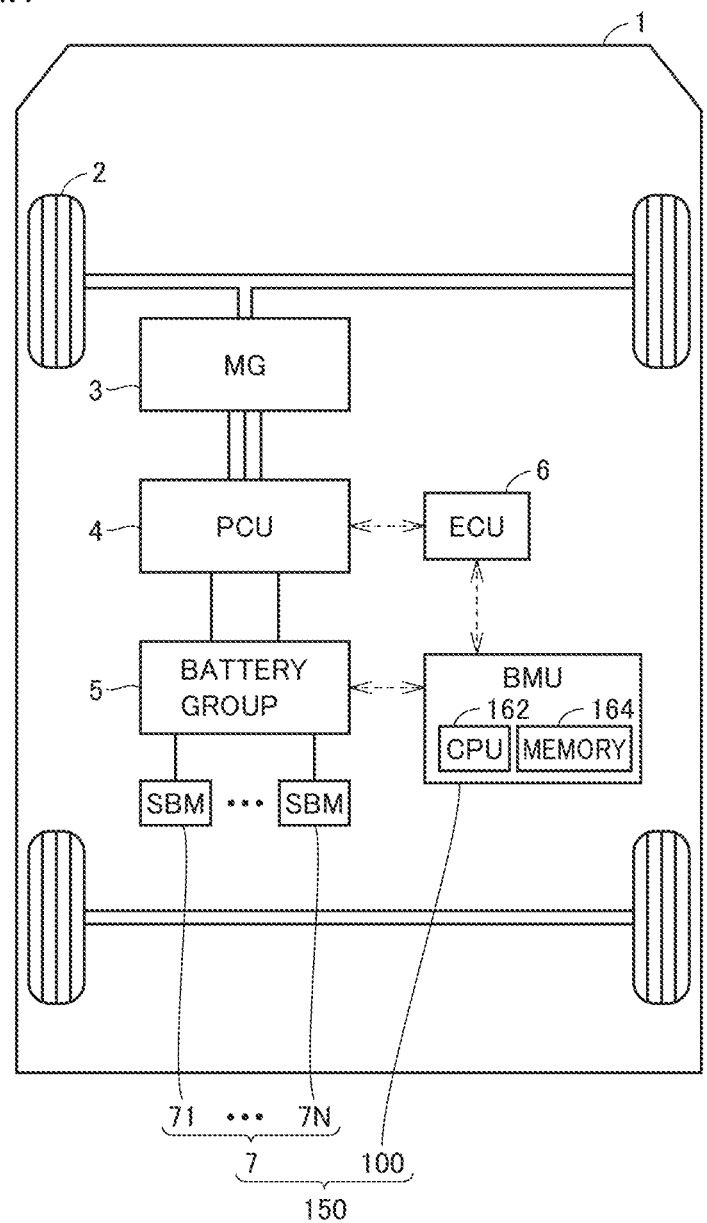
FIG. 1 is a diagram showing an exemplary configuration of a vehicle including a calculation device according to the present embodiment.

Hereinafter, embodiments of the present disclosure will be described in detail with reference to figures. It should be noted that in the figures, the same or corresponding portions are denoted by the same reference characters, and will not be described repeatedly.

First Embodiment

FIG. 1 is a diagram schematically showing an exemplary configuration of a vehicle 1 including a calculation device 150 according to the present embodiment.

Vehicle 1 includes driving wheels 2, a motor generator 3 mechanically coupled to driving wheels 2, a power control unit (PCU) 4, a battery 5, an electronic control unit (ECU) 6, and a calculation device 150. Calculation device 150 includes N SBMs (Satellite Battery Monitor) and a BMU 100. In the description below, the N SBMs are indicated as SBM 71, ..., SBM 7N. N is an integer of 1 or more. The "calculation device" may be referred to as "calculation system". Further, BMU 100 corresponds to a "master", and each of SBM 71, ..., SBM 7N corresponds to a "slave". SBM 71, ..., SBM 7N are also referred to as SBMs 7n. It should be noted that n is a variable (arbitrary number) with n=1, ..., N.

Vehicle 1 is an electrically powered vehicle that travels using motive power of motor generator 3. It should be noted that vehicle 1 may include a motive power source (for example, an engine) other than motor generator 3.

Motor generator 3 is, for example, a three-phase AC rotating electric machine. Motor generator 3 is driven by electric power supplied from battery 5 via PCU 4. Moreover, motor generator 3 can also perform regenerative power generation using motive power transmitted from driving wheels 2, and supply the generated electric power to battery 5 via PCU 4.

Figure 3:
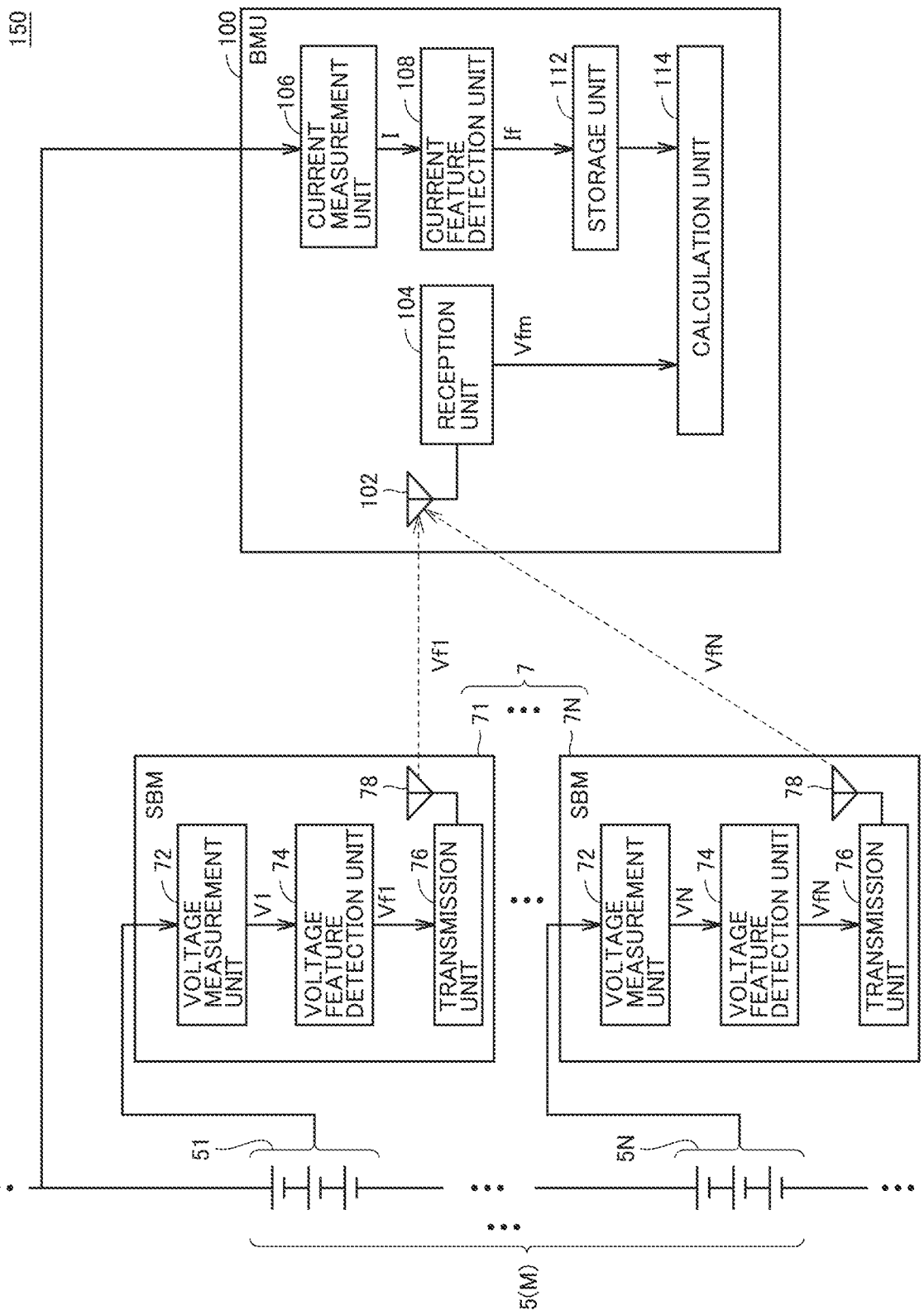
FIG. 3 is a diagram showing an exemplary configuration of the calculation device according to the present embodiment.

Battery 5 includes a secondary battery (chargeable/dischargeable battery) such as a lithium ion battery or a nickel-metal hydride battery. In the present embodiment, battery 5 is constituted of M unit batteries (cells) connected in series. M is an integer of 1 or more, and M≥N. The unit batteries are also referred to as "unit batteries $5m$ (m=1, ..., M)". Further, the M unit batteries are grouped into N battery groups as shown in FIG. 3 described later. Each of the battery groups is also referred to as "battery assembly". The battery group is constituted of one or more unit batteries. For example, the battery group is constituted of 4 to 20 unit batteries. It should be noted that among the battery groups, the number of the constituent unit batteries may be the same or different. The battery groups are also referred to as battery groups 5n. As described above, n is a variable with n=1, ..., N. SBMs 7n are disposed to correspond to battery groups 5n. Further, battery 5 is discharged to a load (for example, the motor generator) and is charged by the above-described regenerative power generation. In the present embodiment, one battery group is constituted of three unit batteries as shown in FIG. 3 described later.

PCU 4 includes an inverter and a step-up/down converter that are each operated in accordance with an instruction from ECU 6. In accordance with the instruction from ECU 6, PCU 4 converts electric power supplied from battery 5 into electric power by which motor generator 3 can be driven and supplies the electric power to motor generator 3, and converts electric power generated by motor generator 3 into chargeable electric power and supplies the electric power to battery 5.

Further, although not shown, vehicle 1 is provided with a plurality of sensors for detecting various physical quantities necessary to control vehicle 1, such as an accelerator pedal operation quantity, a brake pedal operation quantity, and a vehicle speed by the driver. These sensors transmit detection results to ECU 6.

BMU 100 detects a current of battery 5. BMU 100 outputs a detection result to ECU 6. As described below, BMU 100 has a function of detecting the current of battery 5 and has a function of calculating an impedance of battery 5 and a degree of deterioration of resistance of battery 5.

BMU 100 has a CPU (central processing unit) and a memory 164 as main components. Memory 164 has, for example, a ROM (Read Only Memory) and a RAM (Random Access Memory). The ROM stores a program to be executed by CPU 162. The RAM temporarily stores data (for example, a below-described voltage feature quantity) generated by execution of the program by CPU 162, or the like.

ECU 6 performs a predetermined calculation process based on information from each sensor and BMU 100 and information stored in the memory, and controls PCU 4 based on a calculation result.

As described above, N SBMs 7n are disposed to correspond to N battery groups 5n, respectively. As described below, an SBM 7n detects a voltage of each of unit batteries (i.e., three unit batteries) of a battery group 5n corresponding to SBM 7n and a voltage feature quantity of each of the unit batteries of battery group 5n corresponding to SBM 7n. As described below, each of N SBMs 7n transmits the detected voltage feature quantity to BMU 100. In the present embodiment, this transmission is implemented by wireless communication, for example. It should be noted that as a modification, this transmission may be implemented by wired communication. BMU 100 calculates impedances of the M unit batteries based on below-described M voltage feature quantities and one current feature quantity.

Thus, in the present embodiment, the device (BMU 100) for measuring the current value of battery 5 and the devices (N SBMs 7) for measuring the voltage values of the unit batteries are separately provided. Therefore, each of the device for measuring the current value of battery 5 and the devices for measuring the voltage values of the unit batteries can be downsized, thereby improving a degree of freedom in an arrangement of these devices.

Figure 2:
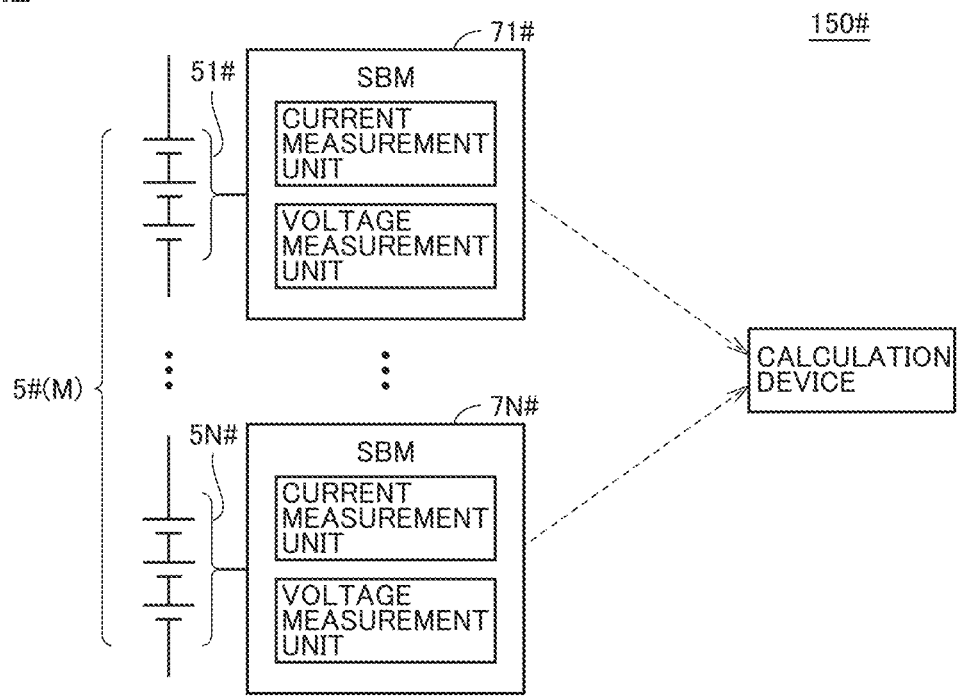
FIG. 2 shows an exemplary configuration of a calculation device of a comparative example.

FIG. 2 shows an exemplary configuration of a calculation device 150 #of a comparative example. As shown in FIG. 2, in calculation device 150 #of the comparative example, a battery 5 #is constituted of M unit batteries (cells) connected in series. Further, battery 5 #is divided into N battery groups 5n#. SBMs 7n#(i.e., N SBMs) are installed to correspond to N battery groups 5n#, respectively. Each of N SBMs 7n#includes: a current measurement unit that measures a current value; and a voltage measurement unit that measures three voltage values. Each of N SBMs 7n#transmits the measured current value and voltage values to the calculation device by wireless communication. Then, the calculation device calculates the impedance of the unit battery based on the voltage values and the current value.

Thus, in calculation device 150 #of the comparative example, it is necessary to provide the current measurement unit for each of N SBMs 7n#. This leads to increased manufacturing cost of calculation device 150 #. N battery groups 5n#are connected in series. In view of this, it is considered to provide one current measurement unit in order to suppress the manufacturing cost.

However, when one current measurement unit is provided, a timing of detection of the current value by the one current measurement unit is different from timings of detection of the voltage values by N SBMs 7 #. That is, the current value and the voltage values are not synchronized. With unsynchronized current and voltage, impedance is not accurately calculated in general. In other words, with calculation device 150 #, the impedance cannot be accurately calculated.

In view of this, in the present embodiment, there is provided calculation device 150 that can calculate an impedance highly accurately while suppressing manufacturing cost.

FIG. 3 is a diagram showing an exemplary configuration of calculation device 150 of the present embodiment. As also illustrated in FIG. 1, calculation device 150 has N SBMs 71, ..., 7N and BMU 100. SBMs 71, ..., 7N are disposed to correspond to battery groups 51, ..., 5N, respectively.

SBM 7 has a voltage measurement unit 72, a voltage feature detection unit 74, a transmission unit 76, and an antenna 78. Voltage measurement unit 72 measures a voltage of each of unit batteries (i.e., three unit batteries) of a battery group 5n corresponding to an SBM 7n including this voltage measurement unit 72. A voltage Vn detected by voltage measurement unit 72 indicates the voltage (i.e., three voltages) of each of the three unit batteries of battery group 5n. Voltage measurement unit 72 is typically constituted of a voltage sensor. Voltage measurement unit 72 outputs a measured voltage Vn to voltage feature detection unit 74.

Voltage feature detection unit 74 monitors voltage Vn output from voltage measurement unit 72, and performs a determination process (process of determining presence or absence of a voltage feature quantity Vfn as described later) per predetermined interrupt period. Vfn represents a voltage feature quantity of each of the three unit batteries of battery group 5n. The interrupt period is a short period of time such as 0.1 second. The voltage feature quantity will be described later. When voltage feature detection unit 74 detects voltage feature quantity Vfn, voltage feature detection unit 74 transmits voltage feature quantity Vfn to transmission unit 76. Transmission unit 76 transmits it to BMU 100 by wireless communication via antenna 78. Further, FIG. 3 shows that voltage feature quantity Vf1 of battery group 51 is transmitted from SBM 71 to BMU 100, and voltage feature quantity VfN of battery group 5N is transmitted from SBM 7N to BMU 100. Vf1 represents the voltage feature quantity of each of the three unit batteries of battery group 51, and VfN represents the voltage feature quantity of each of the three unit batteries of battery group 5N.

BMU 100 includes an antenna 102, a reception unit 104, a current measurement unit 106, a current feature detection unit 108, a storage unit 112, and a calculation unit 114.

Current measurement unit 106 measures a current of battery 5 having battery groups 51 to 5N connected in series. Current measurement unit 106 is typically constituted of a current sensor. Current measurement unit 106 outputs the measured current to current feature detection unit 108.

Current feature detection unit 108 monitors the current output from current measurement unit 106 so as to perform a determination process (process of determining presence or absence of current feature quantity If as described later) per interrupt period. It should be noted that the interrupt period of current feature detection unit 108 may be the same as or different from the interrupt period of voltage feature detection unit 74. The interrupt period of current feature detection unit 108 and the interrupt period of voltage feature detection unit 74 may or may not be synchronized with each other.

Current feature quantity If will be described later. When current feature detection unit 108 detects current feature quantity If, current feature detection unit 108 temporarily stores current feature quantity If into storage unit 112. Further, current feature detection unit 108 also stores, into storage unit 112, time information indicating a time at which current feature quantity If is detected (or a time at which current feature quantity If is stored into storage unit 112). The time information is, for example, a time stamp.

Storage unit 112 is constituted of, for example, the above-described RAM. Further, current feature quantity If is deleted upon passage of a predetermined period (below-described predetermined period T1 in FIG. 6(A)) from the time at which current feature quantity If is stored into storage unit 112.

Reception unit 104 receives, via antenna 102, voltage feature quantity Vfm transmitted from each of N SBMs 7. Here, voltage feature quantity Vfm represents a voltage feature quantity of unit battery Sm. Reception unit 104 outputs received voltage feature quantity Vfm to calculation unit 114.

Whenever calculation unit 114 obtains voltage feature quantity Vfm, calculation unit 114 calculates an impedance of unit battery 5*m* based on voltage feature quantity Vfm and current feature quantity If stored in storage unit 112. For example, calculation unit 114 calculates impedance Rm of unit battery 5*m* by dividing voltage feature quantity Vfm by current feature quantity If as indicated in the following formula (1):

$$Rm = Vfm/If \quad (1)$$

Thus, calculation unit 114 calculates impedance Rm of unit battery Sm based on current feature quantity If and voltage feature quantity Vfm received within a predetermined period (below-described predetermined period T1 in FIG. 6(A)) from a time at which current feature quantity If is obtained.

Further, calculation unit 114 calculates (estimates) a degree of deterioration (degree of deterioration of resistance) of unit battery 5*m* based on calculated impedance Rm and a reference impedance. The reference impedance is a numerical value defined in advance, and is stored in, for example, a predetermined storage region (for example, the ROM of memory 164). For example, as the degree of deterioration of resistance of unit battery 5*m*, calculation unit 114 calculates a ratio obtained by dividing impedance Rm by the reference impedance.

SBM 7*n* corresponds to the "first device" of the present embodiment. BMU 100 corresponds to the "second device" of the present embodiment. The first parameter corresponds to the "voltage value" of the present embodiment. The first feature quantity corresponds to the "voltage feature quantity" of the present embodiment. The second parameter corresponds to the "current value" of the present embodiment. The second feature quantity corresponds to the "current feature quantity" of the present embodiment.

Figure 4:
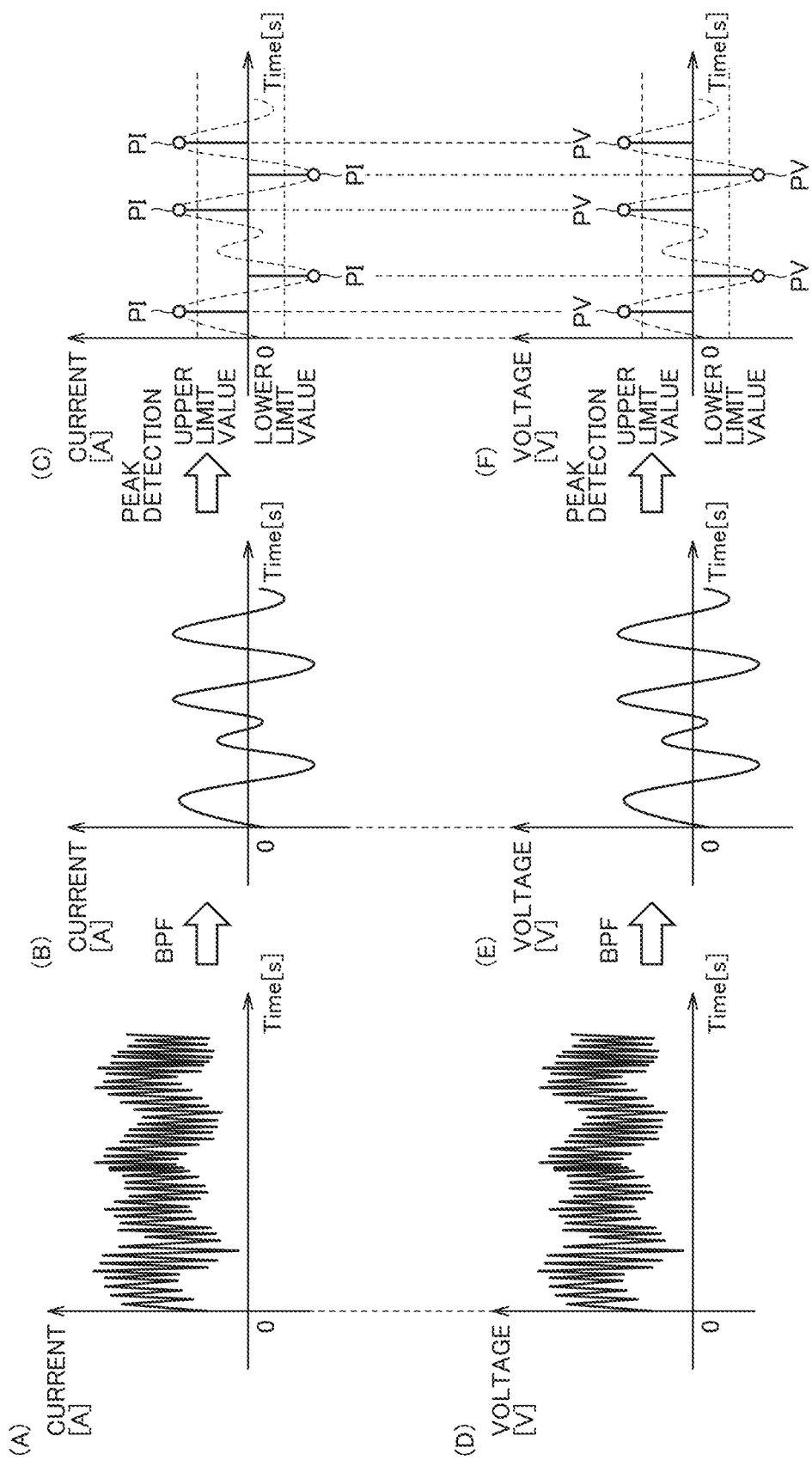
FIG. 4 is a diagram for illustrating a current feature quantity and a voltage feature quantity in the present embodiment.

FIG. 4 is a diagram for illustrating the current feature quantity and the voltage feature quantity in the present embodiment. Each of the horizontal axes of FIGS. 4(A) to (F) and the horizontal axes of FIGS. 8(A) to (F) described later represents a time. Each of the vertical axes of FIGS. 4(A) to (C) and the vertical axes of FIGS. 8(A) to (C) represents a current value, and each of the vertical axes of FIGS. 4(D) to (F) and the vertical axes of FIGS. 8(D) to (F) represent a voltage value.

FIG. 4(A) is a diagram showing an exemplary transition in the current value measured by current measurement unit 106. Current feature detection unit 108 has a band pass filter (BPF) that allows for passage of a current signal having a frequency in a predetermined frequency band and output from current measurement unit 106. Current feature detection unit 108 obtains the signal (hereinafter, referred to as "filtered current signal") having the frequency in the predetermined frequency band. FIG. 4(B) shows an exemplary filtered current signal. It should be noted that current feature detection unit 108 has three band pass filters that respectively allow for passage of the three voltage values detected by voltage measurement unit 72.

Further, as shown in FIG. 4(C), the upper limit value and lower limit value of the current value of the filtered current signal are defined in advance. Current feature detection unit 108 determines whether or not a peak indicated by the filtered current signal is more than or equal to the upper limit value and whether or not the peak is less than or equal to the lower limit value. Then, among peaks indicated by the filtered current signal, current feature detection unit 108 extracts, as current feature quantity If, a peak PI that is more than or equal to the upper limit value. Moreover, among the peaks indicated by the filtered current signal, current feature detection unit 108 extracts, as current feature quantity If, a peak (inverse peak) PI that is less than or equal to the lower limit value. Further, among the peaks indicated by the filtered current signal, current feature detection unit 108 does not detect, as current feature quantity If, a peak that is more than the lower limit value and that is less than the upper limit value.

FIG. 4(D) is a diagram showing an exemplary transition in the voltage value measured by voltage measurement unit 72. Voltage feature detection unit 74 has a band pass filter that allows for passage of a voltage signal having a frequency in a predetermined frequency band and output from voltage measurement unit 72. Voltage feature detection unit 74 obtains the signal (hereinafter, referred to as "filtered voltage signal") having the frequency in the predetermined frequency band. FIG. 4(E) shows an exemplary filtered voltage signal.

Further, as shown in FIG. 4(F), the upper limit value and lower limit value of the voltage value of the filtered voltage signal are defined in advance. Voltage feature detection unit 74 determines whether or not a peak indicated by the filtered voltage signal is more than or equal to the upper limit value and whether or not the peak is less than or equal to the lower limit value. Then, among peaks indicated by the filtered voltage signal, voltage feature detection unit 74 extracts, as voltage feature quantity Vf, a peak PV that is more than or equal to the upper limit value. Further, among the peaks indicated by the filtered voltage signal, voltage feature detection unit 74 extracts, as voltage feature quantity Vf, a peak (inverse peak) PV that is less than or equal to the lower limit value. Further, among the peaks indicated by the filtered voltage signal, voltage feature detection unit 74 does not detect, as voltage feature quantity Vf, a peak that is more than the lower limit value and that is less than the upper limit value.

For each interrupt period (100 ms in the present embodiment), current feature detection unit 108 performs the determination process of determining presence or absence of the current feature quantity. When current feature detection unit 108 determines that the current feature quantity is present in the determination process, current feature detection unit 108 detects the current feature quantity.

Regarding noticeable current feature quantity If and voltage feature quantity Vf, as shown in FIG. 4, a timing at which voltage feature detection unit 74 detects the voltage feature quantity is the same or substantially the same as a timing at which current feature detection unit 108 detects the current feature quantity.

Figure 5:
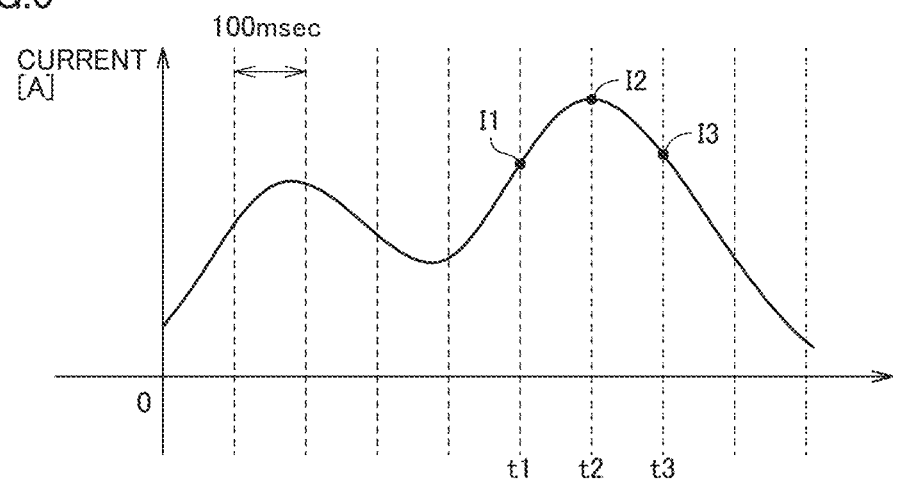

FIG. 5 is a diagram for illustrating timings of detection of the peak corresponding to the current feature quantity and the peak corresponding to the voltage feature quantity. In FIG. 5, the timing of detection of the peak corresponding to the current feature quantity is shown; however, the timing of detection of the peak corresponding to the voltage feature quantity is also the same as in FIG. 5.

FIG. 5 shows that current feature detection unit 108 performs a peak determination process per 100 ms. The peak determination process is a process of determining whether or not a peak is present. Further, in FIG. 5, current feature detection unit 108 detects a current value I1 at a timing t1. At a timing t2 100 ms after timing t1, current feature detection unit 108 detects a current value I2. At a timing t3 100 ms after timing t2, current feature detection unit 108 detects a current value I3.

Then, as a peak of the current value, current feature detection unit 108 detects current value I2 that satisfies: current value I2>current value I1 and current value I2>current value I3. When this peak is more than or equal to the upper limit value (see FIG. 4), this peak is detected as the current feature quantity. It should be noted that although not particularly shown, as an inverse peak of the current value, current feature detection unit 108 detects current value I2 that satisfies: current value I2<current value I1 and current value I2<current value I3. When the inverse peak is less than or equal to the lower limit value (see FIG. 4), the inverse peak is detected as the current feature quantity. It should be noted that voltage feature detection unit 74 also performs a similar process.

Figure 6:
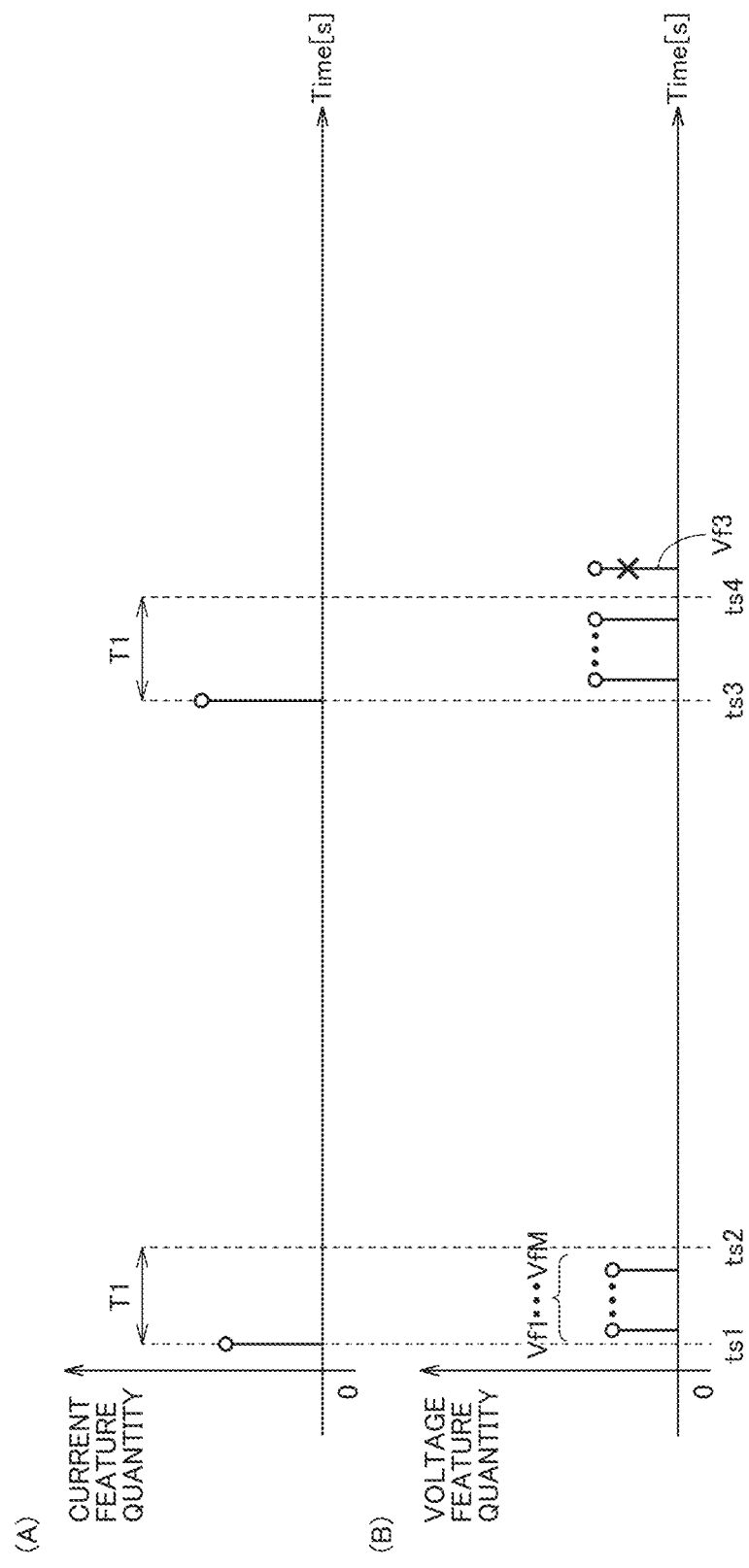

FIG. 6 is a diagram for illustrating the process by current feature detection unit 108. FIG. 6(A) shows a timing at which current feature detection unit 108 detects the current feature quantity. FIG. 6(B) shows a timing at which reception unit 104 obtains the voltage feature quantity.

It is assumed that at a timing ts1, current feature detection unit 108 detects the current feature quantity. Here, as illustrated in FIG. 4, regarding noticeable current feature quantity If and voltage feature quantity Vfm, the timing at which voltage feature detection unit 74 detects the voltage feature quantity is the same or substantially the same as the timing at which current feature detection unit 108 detects the current feature quantity. In other words, current feature quantity If and voltage feature quantity Vfm corresponding to current feature quantity If are synchronized with each other. Further, as illustrated in FIG. 1 and the like, each SBM 7 detects voltage feature quantity Vfm and transmits voltage feature quantity Vfm to BMU 100 by wireless communication. Therefore, there is a temporal deviation between the timing at which voltage feature detection unit 74 detects the voltage feature quantity and the timing at which current feature detection unit 108 obtains the voltage feature quantity (timing at which BMU 100 obtains the voltage feature quantity or timing at which the voltage feature quantity is stored into storage unit 112). This temporal deviation is a deviation based on a time of communication for the voltage feature quantity from SBM 7n to BMU 100.

To address this, in the present embodiment, voltage feature quantity Vfm obtained by BMU 100 within a predetermined period from timing ts1 at which current feature quantity If is detected is regarded as being synchronized with current feature quantity If. Then, based on current feature quantity If and voltage feature quantity Vfm regarded as being synchronized with current feature quantity If (with current feature quantity If and voltage feature quantity Vfm being handled as a pair), BMU 100 calculates impedance Rm of unit battery 5m corresponding to voltage feature quantity Vfm (see the above-described formula (1)). Therefore, calculation device 150 of the present embodiment can calculate the impedance accurately as compared with a "calculation device that calculates the impedance based on current feature quantity If and voltage feature quantity Vfm not synchronized with each other". Further, since it is unnecessary to provide a current detection unit for each SBM 7n unlike in the calculation device of the comparative example, manufacturing cost can be suppressed.

FIG. 6 shows that reception unit 104 obtains voltage feature quantities Vf1 to VfM of all unit batteries Sm from all SBMs 71 to 7N during predetermined period T1 (period from timing ts1 to timing ts2). In this case, BMU 100 calculates the impedances of all the unit batteries.

Further, it is shown that in a predetermined period T1 from a timing ts3, reception unit 104 does not obtain voltage feature quantity Vf3 of unit battery 53, but reception unit 104 obtains the other voltage feature quantities. In this case, BMU 100 calculates the impedances of the unit batteries other than unit battery 53 and does not calculate the impedance of unit battery 53. In this case, it is considered to configure such that BMU 100 calculates impedance R3 of unit battery 53. However, current feature quantity If and voltage feature quantity Vf3 may not be synchronized with each other. Therefore, with this configuration, impedance R3 is calculated using current feature quantity If and voltage feature quantity Vf3 not synchronized with each other, with the result that impedance R3, which is highly likely to be inaccurate, is calculated. Thus, in the present embodiment, an impedance of a unit battery corresponding to a voltage feature quantity obtained in a period other than the predetermined period is not calculated.

Further, in the present embodiment, calculation device 150 can calculate the impedance of the unit battery based on the peak of the current value and the peak of the voltage value. Therefore, calculation device 150 can calculate the impedance of the unit battery by a relatively simple calculation process.

Predetermined period T1 may be a fixed value. For example, predetermined period T1 may be any period that is less than or equal to a maximum communication delay time (corresponding to the above-described temporal deviation)

assumed to be larger than 0. Predetermined period T1 may be a variable value. For example, predetermined period T1 may be a period from a time at which the current feature quantity (peak PI in the present embodiment) is detected to a time at which the next current feature quantity (peak PI in the present embodiment) is detected.

Figure 7:
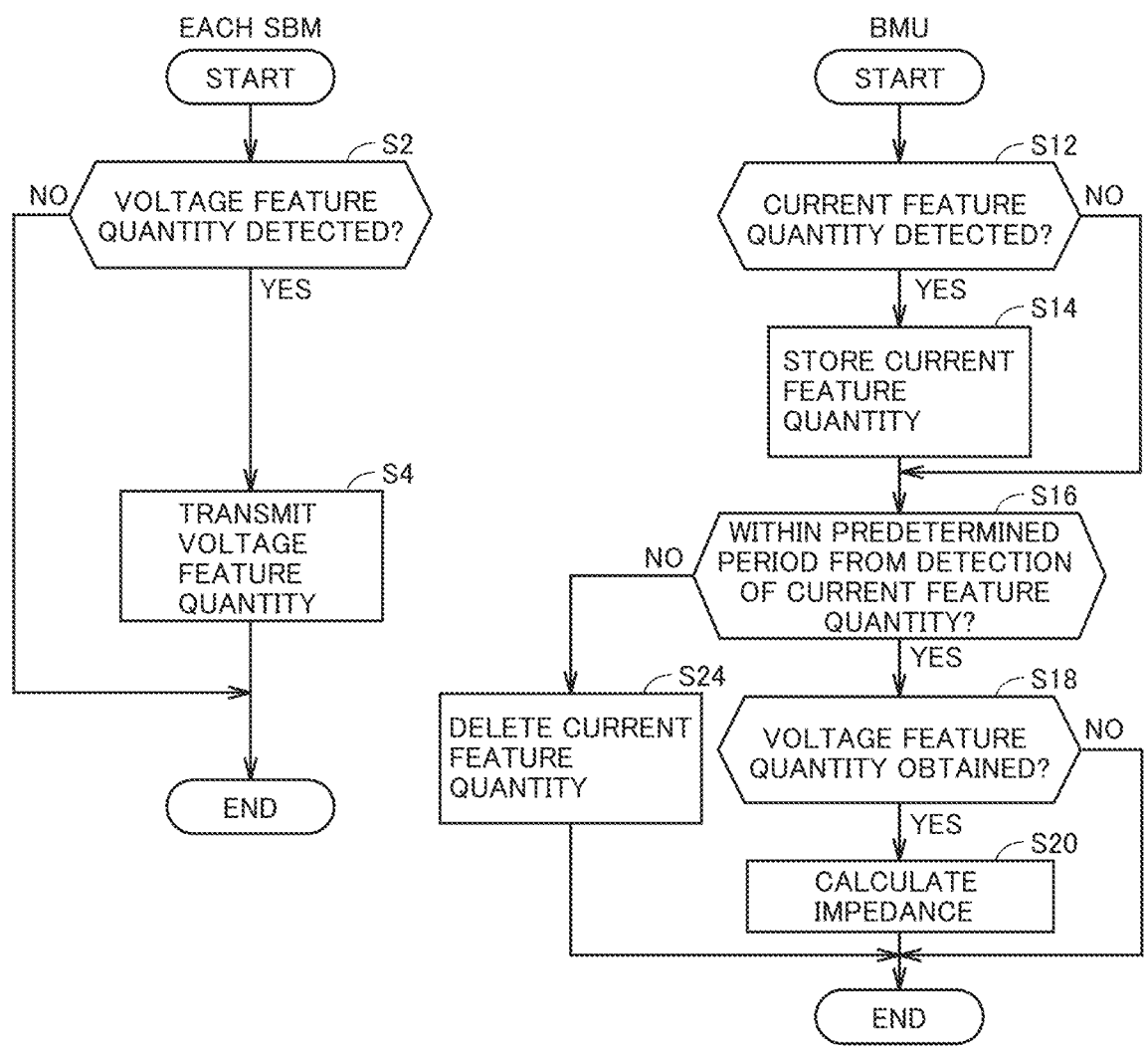
FIG. 7 is a flowchart showing processes by each SBM and a BMU.

FIG. 7 is a flowchart showing processes by each SBM 7 and BMU 100. The process by each SBM 7 in FIG. 7 and the process by BMU 100 in FIG. 7 are performed per interrupt period described above.

In a step S2, each SBM determines whether or not voltage feature quantity Vf is detected (the above-described determination process is performed). When voltage feature quantity Vf is not detected (NO in step S2), the process is ended. On the other hand, when voltage feature quantity Vf is detected (YES in step S2), each SBM 7 transmits detected voltage feature quantity Vf to BMU 100 in a step S4.

Meanwhile, in a step S12, BMU 100 determines whether or not current feature quantity If is detected (the above-described determination process is performed). When current feature quantity If is not detected (NO in step S12), the process proceeds to a step S16. On the other hand, when current feature quantity If is detected (YES in step S12), BMU 100 stores current feature quantity If into storage unit 112 in a step S14. Next, in step S16, BMU 100 determines whether or not the present time is within predetermined period T1 from the time at which current feature quantity If is stored thereinto. The determination in step S16 is implemented based on the above-described time stamp and the present time. BMU 100 has a timer, and BMU 100 can recognize the present time based on the timer. When the present time is not within predetermined period T1 from the time at which current feature quantity If is stored thereinto (NO in step S16), i.e., when the period from the time at which current feature quantity If is stored thereinto to the present time reaches predetermined period T1, BMU 100 deletes current feature quantity If in storage unit 112. Then, the process is ended.

When the present time is within predetermined period T1 from the time at which current feature quantity If is stored (YES in step S16), BMU 100 determines in a step S18 whether or not the voltage feature quantity is obtained from SBM 7n. When the voltage feature quantity is not obtained (NO in step S18), the process is ended. On the other hand, when the voltage feature quantity is obtained (YES in step S18), in a step S20, BMU 100 calculates impedance Rm (see the above-described formula (1)). Specifically, BMU 100 calculates impedance Rm based on current feature quantity If stored in step S14 and voltage feature quantity Vfm determined to be obtained in step S18.

Further, in the example of FIG. 7, each SBM spontaneously performs the process of detecting the voltage feature quantity in step S2.

Second Embodiment

Figure 8:
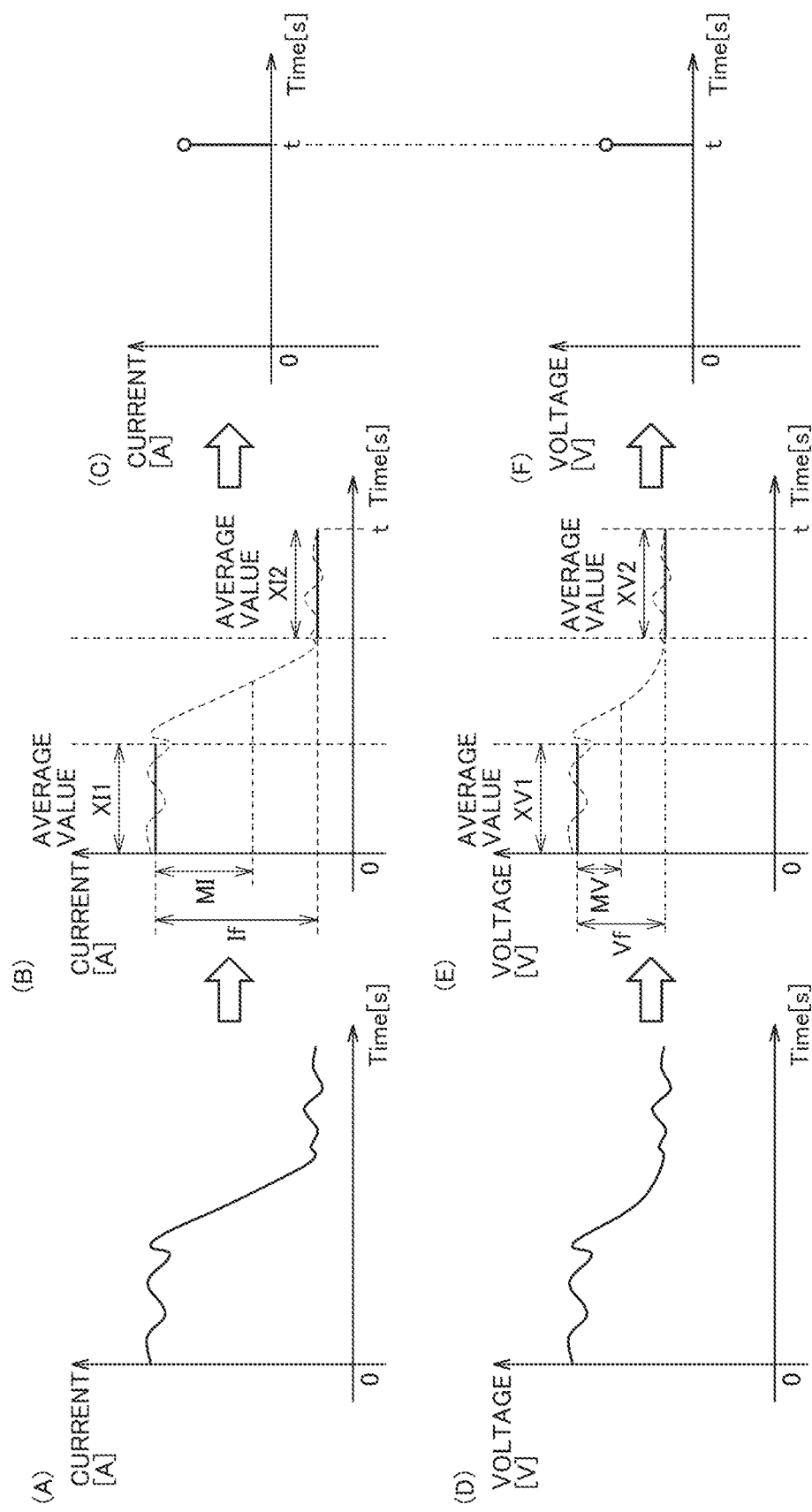
FIG. 8 is a diagram for illustrating a current feature quantity and a voltage feature quantity in a second embodiment.

In a second embodiment, the current feature quantity includes a fluctuation quantity of the current value, and the voltage feature quantity includes a fluctuation quantity of the voltage value. Each fluctuation quantity includes at least one of a quantity of increase and a quantity of decrease. FIG. 8 is a diagram for illustrating the current feature quantity and the voltage feature quantity in the second embodiment. FIG. 8 illustratively shows that battery 5 is being charged. Further, FIG. 8 illustratively shows that the current value is decreased when battery 5 is being charged.

FIG. 8(A) is a diagram showing an exemplary transition in the current value measured by current measurement unit 106. Further, in the second embodiment, current feature detection unit 108 performs a calculation process of calculating a moving average value (hereinafter, also referred to as "current average value") of the current value in a past specific period (for example, one second). This calculation process is performed per predetermined interrupt period (100 ms as described above).

Current feature detection unit 108 determines whether or not the fluctuation quantity of the current value is more than or equal to a predetermined quantity MI. Then, as shown in FIG. 8(B), as current feature quantity If, current feature detection unit 108 detects a fluctuation quantity when the fluctuation quantity of the current value is more than or equal to predetermined quantity MI. Predetermined quantity MI corresponds to the "second predetermined quantity" of the present disclosure. In the example of FIG. 8, it is shown that a difference quantity (fluctuation quantity) between a current average value XI1 and a current average value XI2 is more than or equal to predetermined quantity MI. As shown in FIG. 8(C), the timing of detection of the current feature quantity (i.e., timing ts1 in FIG. 6(A)) corresponds to timing t in FIG. 8 (B). Timing t is a timing at which it is determined that the fluctuation of the current average value is ended.

The end of the fluctuation of the average value (each of the current average value, a below-described voltage average value, and a below-described difference average value) is determined in, for example, the following manner: when a state in which a difference between the maximum value and minimum value of the average value falls below a predetermined range (i.e., a state in which the amplitude of the average value is small) continues for a certain period (for example, the above-described specific period), it is determined that the fluctuation of the average value is ended. Further, when a state in which a difference between the maximum value and minimum value of the current value falls below a predetermined range (i.e., a state in which the amplitude of the current value is small) continues for a certain period, it may be determined that the fluctuation of the current average value is ended. Further, when a state in which a difference between the maximum value and minimum value of the voltage value falls below a predetermined range (i.e., a state in which the amplitude of the voltage value is small) continues for a certain period, it may be determined that the fluctuation of the voltage average value is ended.

FIG. 8(D) is a diagram showing an exemplary transition in the voltage value measured by voltage measurement unit 72. Further, in the second embodiment, voltage feature detection unit 74 performs a calculation process of calculating a moving average value (hereinafter, also referred to as "voltage average value") of the voltage value in a past specific period (for example, one second). This calculation process is performed per predetermined interrupt period (100 ms as described above).

Voltage feature detection unit 74 determines whether or not the fluctuation quantity of the voltage value is more than or equal to a predetermined quantity MV. Then, as shown in FIG. 8(E), as voltage feature quantity IV, voltage feature detection unit 74 detects a fluctuation quantity when the fluctuation quantity of the voltage value becomes more than or equal to predetermined quantity MV. Predetermined quantity MV corresponds to the "first predetermined quantity" of the present disclosure. In the example of FIG. 8(E), it is shown that a difference quantity (fluctuation quantity)

between a voltage average value XV1 and a voltage average value XV2 is more than or equal to predetermined quantity MV. As shown in FIG. 8(F), the timing of detection of the voltage feature quantity corresponds to timing t in FIG. 8(E). Timing t is a timing at which it is determined that the fluctuation of the voltage average value is ended.

Thus, in the present embodiment, the current feature quantity includes the fluctuation quantity of the current value, and the voltage feature quantity includes the fluctuation quantity of the voltage value. Therefore, calculation device 150 can calculate the impedance of the unit battery by a relatively simple calculation process. Particularly, since the current and the voltage are fluctuated in a stepwise manner during charging of battery 5, a highly accurate current value fluctuation quantity (fluctuation quantity that is more than or equal to predetermined quantity MI) and a highly accurate voltage value fluctuation quantity (fluctuation quantity that is more than or equal to predetermined quantity MV) can be obtained. As a result, calculation device 150 can calculate a highly accurate impedance.

Third Embodiment

In a third embodiment, the current feature quantity includes a fluctuation quantity when the current value crosses zero, and the voltage feature quantity includes a fluctuation quantity when a difference value crosses zero.

Here, the difference value will be described. The difference value is a difference value between the voltage value detected by voltage measurement unit 72 and an open circuit voltage (OCV) of unit battery 5m. In the present embodiment, the difference value is a value obtained by subtracting the open circuit voltage from the voltage value.

In the third embodiment, voltage feature detection unit 74 estimates the OCV of the unit battery by performing a predetermined calculation with regard to the voltage value from voltage measurement unit 72. The predetermined calculation is, for example, a calculation to allow a voltage signal from voltage measurement unit 72 to pass through a low pass filter. Voltage feature detection unit 74 calculates the difference value by subtracting the OCV from the voltage value.

Further, in the present embodiment, when battery 5 is being discharged, each of the current value measured by current measurement unit 106 and the difference value calculated by voltage feature detection unit 74 may be increased, may cross zero, and may become a positive value. On the other hand, when battery 5 is being charged, each of the current value measured by current measurement unit 106 and the difference value calculated by voltage feature detection unit 74 may be decreased, may cross zero, and may become a negative value.

It should be noted that as a modification, voltage measurement unit 72 and current measurement unit 106 may be installed such that when battery 5 is being discharged, each of the current value and the difference value is decreased, crosses zero, and becomes a negative value, whereas when battery 5 is being charged, each of the current value and the difference value is increased, crosses zero, and becomes a positive value.

Figure 9:
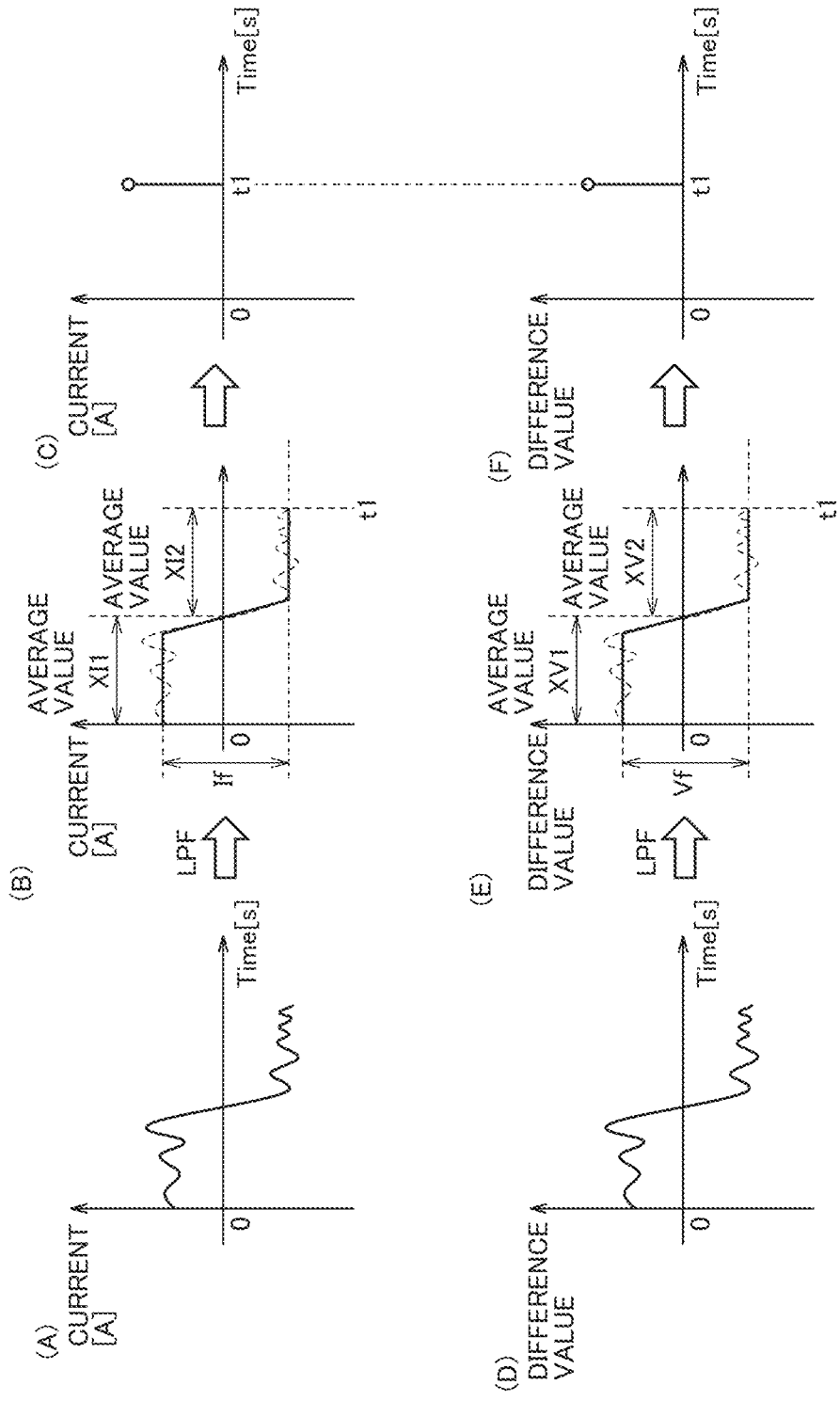
FIG. 9 is a diagram for illustrating a current feature quantity and a voltage feature quantity in a third embodiment.

FIG. 9 is a diagram for illustrating the current feature quantity and the voltage feature quantity in the third embodiment. FIG. 9(A) is a diagram showing an exemplary transition in the current value measured by current measurement unit 106. Current feature detection unit 108 has a low pass filter (LPF) that allows for passage of a current signal that has a frequency falling within or below a predetermined frequency band and that is output from current measurement unit 106. Current feature detection unit 108 obtains the filtered current signal having passed through the LPF. FIG. 9(B) shows an exemplary filtered current signal. Further, in the third embodiment, current feature detection unit 108 performs a calculation process of calculating the current average value for a past specific period (for example, one second). This calculation process is performed per predetermined interrupt period (100 ms as described above).

Current feature detection unit 108 determines whether or not the current value crosses zero. Then, as shown in FIG. 9(B), as current feature quantity If, current feature detection unit 108 detects the fluctuation quantity of the current value when the current value crosses zero. In the example of FIG. 9, a current average value XI1 and a current average value XI2 are shown. Current average value XI1 is a current average value before the zero crossing. Current average value XI2 is a current average value after the current value from which current average value XI1 has been calculated crosses zero.

In the example of FIG. 9(B), current feature detection unit 108 calculates a difference value between current average value XI1 and current average value XI2 as current feature quantity If. Further, FIG. 9(C) shows a timing t1 at which current feature quantity If is detected. Timing t1 corresponds to timing ts1 in FIG. 6(A). Further, timing t1 is a timing at which it is determined that the fluctuation of the current average value is ended.

FIG. 9(D) is a diagram showing an exemplary transition in the difference value calculated by voltage feature detection unit 74. Voltage feature detection unit 74 has a low pass filter that allows for passage of a signal indicating the difference value and having a frequency falling within or below a predetermined frequency band. Current feature detection unit 108 obtains a filtered difference value signal having passed through the LPF. Further, in the third embodiment, voltage feature detection unit 74 performs a calculation process of calculating an average value (hereinafter, also referred to as "difference average value") of the difference value in a past specific period (for example, one second) based on the filtered difference value signal. This calculation process is performed per predetermined interrupt period (100 ms as described above).

Voltage feature detection unit 74 determines whether or not the difference value crosses zero. Then, as shown in FIG. 9(E), as voltage feature quantity Vf, voltage feature detection unit 74 detects the fluctuation quantity of the difference value when the difference value crosses zero. In the example of FIG. 9, a difference average value XV1 and a difference average value XV2 are shown. Difference average value XV1 is a difference average value before the zero crossing. Difference average value XV2 is a difference average value after the difference value from which difference average value XV1 has been calculated crosses zero.

In the example of FIG. 9(E), voltage feature detection unit 74 calculates a difference value between difference average value XV1 and difference average value XV2 as voltage feature quantity Vf. FIG. 9(F) shows a timing t1 at which voltage feature quantity Vf is detected. Timing t1 is a timing at which it is determined that the fluctuation of the difference average value is ended.

Thus, in the present embodiment, voltage feature quantity Vf includes the fluctuation quantity when the difference average value crosses zero, and current feature quantity If includes the fluctuation quantity when the current value crosses zero. Particularly, calculation device 150 uses, as the current feature quantity and the voltage feature quantity, fluctuation quantities at a timing of switching between charging and discharging of battery 5 (for example, timing of switching between stepping on the accelerator pedal of vehicle 1 and stepping off the accelerator pedal of vehicle 1). The fluctuation quantities of the current value and the difference value are large at the timing of switching between the charging and the discharging. This leads to improved accuracy in calculating the impedance of battery 5. Further, since the switching between the charging and the discharging occurs at frequent timings, the current feature quantity and the voltage feature quantity can be detected highly frequently. Therefore, the impedance of the unit battery can be calculated more frequently.

Current feature quantity VI may include the fluctuation quantity of the current value when the current value crosses zero (see FIG. 9(B)), and voltage feature quantity Vf may include the fluctuation quantity of the voltage value that is more than or equal to predetermined quantity MV (first predetermined quantity) (see FIG. 8(E)). Calculation device 150 employing such a configuration also exhibits the same advantageous effect as the one described above.

It should be noted that at least two combinations of the current feature quantities and the voltage feature quantities described in the first to third embodiments may be employed.

Fourth Embodiment

In each of the first to third embodiments, it has been illustrated that the plurality of (M) unit batteries are connected in series. However, the plurality of unit batteries may be connected in parallel. The following describes an example in which N (a plurality of) unit batteries are connected in parallel. In this example, one voltage value is detected, and N current values are detected. Further, in a fourth embodiment, the first parameter corresponds to the "current value" and the second parameter corresponds to the "voltage value".

Figure 10:
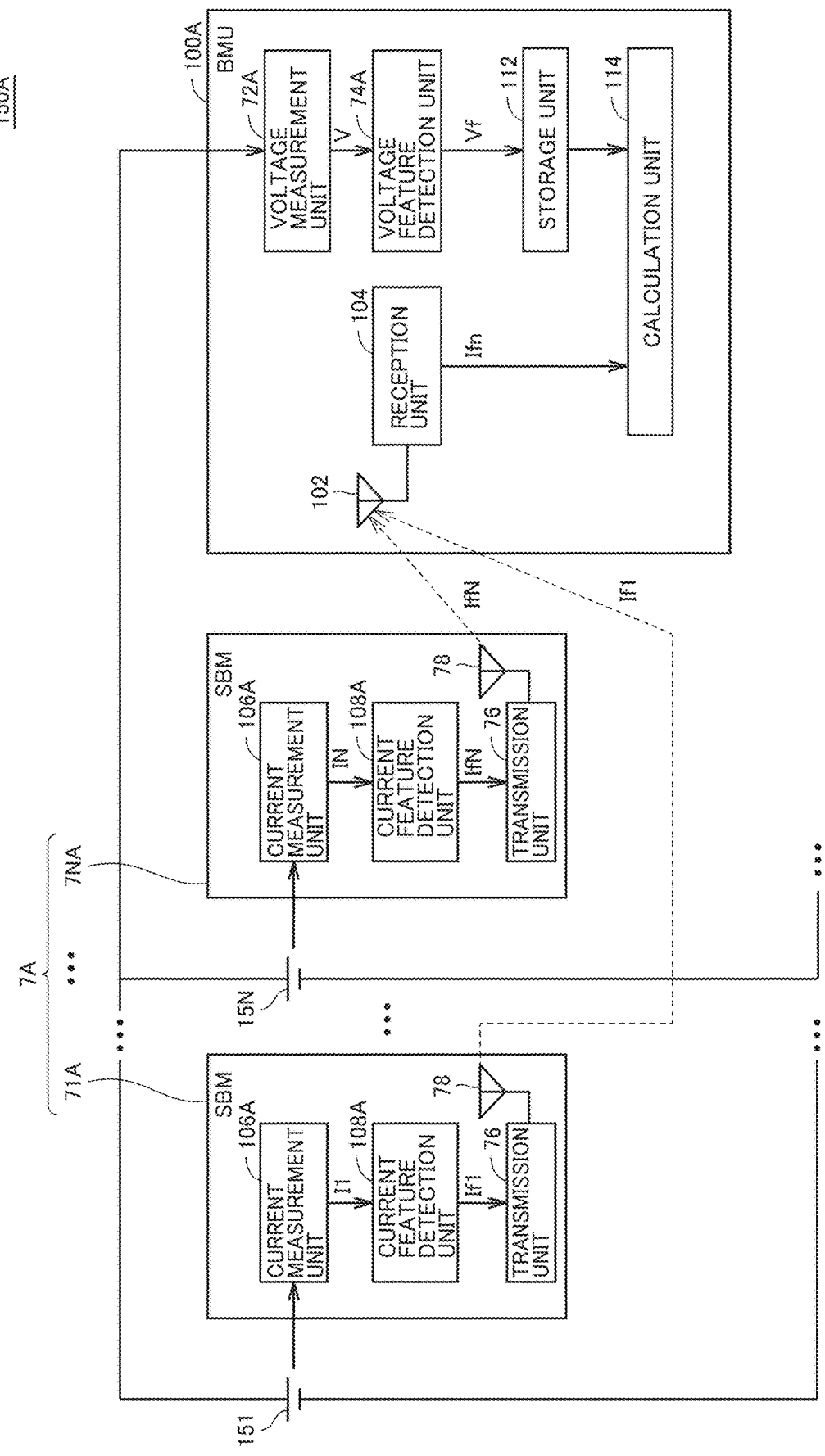
FIG. 10 is a diagram showing an exemplary configuration of a calculation device 150 according to a fourth embodiment.

FIG. 10 is a diagram showing an exemplary configuration of a calculation device 150A according to the fourth embodiment. In the example of FIG. 10, it is illustrated that N unit batteries 151 to 15N are connected in parallel. Calculation device 150A has N SBMs 71A, . . . , 7NA and a BMU 100A. SBMs 71A, . . . , 7NA are respectively disposed to correspond to unit batteries 151, . . . , 15N connected in parallel. N SBMs 71A, . . . , 7NA are also collectively referred to as "SBM 7A" or "SBM 7nA".

SBM 7nA has a current measurement unit 106A, a current feature detection unit 108A, a transmission unit 76, and an antenna 78. Current measurement unit 106A measures current value In of unit battery 15n corresponding to SBM 7nA including current measurement unit 106A. Current feature detection unit 108A monitors a current value In output from current measurement unit 106A so as to detect a current feature quantity Ifn per interrupt period. When current feature detection unit 108A detects current feature quantity Ifn, current feature detection unit 108A transmits current feature quantity Ifn to transmission unit 76. Transmission unit 76 transmits it to BMU 100 by wireless communication via antenna 78. FIG. 10 shows that current feature quantity If1 is transmitted from SBM 71 to BMU 100, and current feature quantity IfN is transmitted from SBM 7N to BMU 100.

BMU 100A has an antenna 102, a reception unit 104, a voltage measurement unit 72A, a voltage feature detection unit 74A, a storage unit 112, and a calculation unit 114.

Voltage measurement unit 72A measures a voltage value V of each of unit batteries 151 to 15N connected in parallel. Voltage measurement unit 72A outputs measured voltage value V to voltage feature detection unit 74A.

Voltage feature detection unit 74 monitors a voltage value V output from voltage measurement unit 72 so as to detect voltage feature quantity Vf per interrupt period. When voltage feature detection unit 74 detects voltage feature quantity Vf, voltage feature quantity Vf is stored into storage unit 112. Further, voltage feature quantity Vf is deleted upon passage of a predetermined period (predetermined period T1 described above) from a time at which voltage feature quantity Vf is stored into storage unit 112.

Further, via antenna 102, reception unit 104 receives current feature quantity Ifn transmitted from each of N SBMs 7A. Reception unit 104 outputs received current feature quantity Ifn to calculation unit 114.

Whenever calculation unit 114 obtains current feature quantity Ifn, calculation unit 114 calculates impedance Rn of unit battery 15n based on current feature quantity Ifn and voltage feature quantity Vf stored in storage unit 112 in accordance with the following formula (2):

$$Rn = Vf/Ifn \qquad (2)$$

According to such a configuration, also when the unit batteries are connected in parallel, calculation device 150A can accurately calculate the impedance of the battery while suppressing manufacturing cost.

Other Embodiments (1) In each of the above-described embodiments, it has been illustrated that one SBM 7n detects voltage feature quantity Vfn of each of the one or more unit batteries of battery group 5n. However, one SBM 7n may be disposed to correspond to one unit battery, and one SBM 7n may detect the voltage feature quantity of the one unit battery. Further, one SBM 7n may detect the voltage feature quantity of battery group 5n. That is, the "impedance of the battery" in the present disclosure may be defined as follows: "the impedance of each of the one or more unit batteries of the battery group corresponding to one SBM 7n"; "the impedance of one unit battery corresponding to one SBM 7n"; or "the impedance of the battery group corresponding to one SBM 7n".

(2) It has been illustrated that BMU 100 performs the determination in step S16 (see FIG. 7) using the time stamp. However, for example, BMU 100 may perform the determination in step S16 using a storage flag. Here, the storage flag is a flag indicating that current feature quantity If is stored in storage unit 112. When current feature quantity If is stored into storage unit 112 in step S14, BMU 100 stores the storage flag into a predetermined region. Further, when current feature quantity If is deleted in step S24, BMU 100 also deletes the storage flag.

When it is determined in step S16 that the storage flag is stored in the predetermined region, BMU 100 determines YES in step S16. On the other hand, when it is determined in step S16 that the storage flag is not stored in the predetermined region, BMU 100 determines NO in step S16. Further, the determination process in step S16 may be implemented by another method.

Although the embodiments of the present invention have been described and illustrated in detail, it is clearly understood that the same is by way of illustration and example only and is not to be taken by way of limitation, the scope of the present invention being interpreted by the terms of the appended claims. The scope of the present invention is defined by the terms of the claims, and is intended to include any modifications within the scope and meaning equivalent to the terms of the claims.

What is claimed is:

1. A calculation device for calculating an impedance of a battery, the calculation device comprising a first device and a second device, wherein
the first device measures a first parameter that is one of a current of the battery and a voltage of the battery,
the first device detects a first feature quantity that is a feature quantity of the first parameter,
the first device transmits the first feature quantity to the second device,
the second device measures a second parameter that is the other of the current and the voltage,
the second device detects a second feature quantity that is a feature quantity of the second parameter,
the second device obtains the first feature quantity transmitted from the first device, and
the second device calculates the impedance based on the first feature quantity and the second feature quantity, the first feature quantity being received within a predetermined period from a time at which the second feature quantity is obtained, wherein
the first feature quantity includes a fluctuation quantity of the first parameter,
the second feature quantity includes a fluctuation quantity of the second parameter,
the fluctuation quantity of the first parameter includes a fluctuation quantity that is more than or equal to a first predetermined quantity, and
the fluctuation quantity of the second parameter includes a fluctuation quantity that is more than or equal to a second predetermined quantity.

2. The calculation device according to claim 1, wherein
the first feature quantity includes a peak of the first parameter, and
the second feature quantity includes a peak of the second parameter.

3. A calculation device for calculating an impedance of a battery, the calculation device comprising a first device and a second device, wherein
the first device measures a first parameter that is one of a current of the battery and a voltage of the battery,
the first device detects a first feature quantity that is a feature quantity of the first parameter,
the first device transmits the first feature quantity to the second device,
the second device measures a second parameter that is the other of the current and the voltage,
the second device detects a second feature quantity that is a feature quantity of the second parameter,
the second device obtains the first feature quantity transmitted from the first device, and
the second device calculates the impedance based on the first feature quantity and the second feature quantity, the first feature quantity being received within a predetermined period from a time at which the second feature quantity is obtained, wherein
the first feature quantity includes a fluctuation quantity of the first parameter,
the second feature quantity includes a fluctuation quantity of the second parameter,
the first parameter is the voltage of the battery,
the second parameter is the current of the battery,
the fluctuation quantity of the first parameter includes a fluctuation quantity that is more than or equal to a first predetermined quantity, and
the fluctuation quantity of the second parameter includes a fluctuation quantity of the current value when a value of the current of the battery crosses zero.

4. The calculation device according to claim 3, wherein
the first feature quantity includes a peak of the first parameter, and
the second feature quantity includes a peak of the second parameter.

5. A calculation device for calculating an impedance of a battery, the calculation device comprising a first device and a second device, wherein
the first device measures a first parameter that is one of a current of the battery and a voltage of the battery,
the first device detects a first feature quantity that is a feature quantity of the first parameter,
the first device transmits the first feature quantity to the second device,
the second device measures a second parameter that is the other of the current and the voltage,
the second device detects a second feature quantity that is a feature quantity of the second parameter,
the second device obtains the first feature quantity transmitted from the first device, and
the second device calculates the impedance based on the first feature quantity and the second feature quantity, the first feature quantity being received within a predetermined period from a time at which the second feature quantity is obtained, wherein
the first feature quantity includes a peak of the first parameter,
the second feature quantity includes a peak of the second parameter,
the first parameter is the voltage of the battery,
the second parameter is the current of the battery,
the first feature quantity includes a fluctuation quantity of a difference value between a value of the voltage of the battery and an OCV (Open Circuit Voltage) of the battery when the difference value crosses zero, and
the second feature quantity includes a fluctuation quantity of a value of the current when the value of the current of the battery crosses zero.

6. The calculation device according to claim 5, wherein
the first feature quantity includes a fluctuation quantity of the first parameter, and
the second feature quantity includes a fluctuation quantity of the second parameter.

* * * * *